(12) United States Patent
Choi (10) Patent No.: US 11,908,882 B2
(45) Date of Patent: Feb. 20, 2024

(54) DISPLAY DEVICE (71) Applicant: SAMSUNG DISPLAY CO., LTD., Yongin-si (KR)

(72) Inventor: Hyong Do Choi, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 328 days.

(21) Appl. No.: 17/182,591

(22) Filed: Feb. 23, 2021

(65) Prior Publication Data

US 2022/0013575 A1 Jan. 13, 2022

(30) Foreign Application Priority Data

Jul. 9, 2020 (KR) .................. 10-2020-0084732

(51) Int. Cl.
| | |
|---|---|
| *H01L 27/15* | (2006.01) |
| *H01L 33/62* | (2010.01) |
| *H05K 1/18* | (2006.01) |
| *H01L 33/38* | (2010.01) |
| *G09G 3/32* | (2016.01) |

(52) U.S. Cl.
CPC ............ *H01L 27/156* (2013.01); *G09G 3/32* (2013.01); *H01L 33/38* (2013.01); *H01L 33/62* (2013.01); *H05K 1/189* (2013.01); *G09G 2310/0267* (2013.01); *H05K 2201/10128* (2013.01)

(58) Field of Classification Search
CPC ....... H01L 27/156; H01L 33/38; H01L 33/62; G09G 3/32; G09G 2310/0267; G09G 2300/0408; G09G 3/3266; G09G 3/3233; G09G 3/3258; H05K 1/189; H05K 2201/10128

See application file for complete search history.

(56) References Cited

U.S. PATENT DOCUMENTS

| | | | |
|---|---|---|---|
| 8,743,024 B2 | 6/2014 | Kim | |
| 9,384,706 B2 | 7/2016 | Choi et al. | |
| 2007/0268081 A1* | 11/2007 | Nishiyama | H03K 3/354 331/111 |
| 2009/0021497 A1* | 1/2009 | Wendler | H05B 47/00 345/204 |
| 2012/0062608 A1* | 3/2012 | Kim | G09G 3/3233 327/108 |

(Continued)

FOREIGN PATENT DOCUMENTS

| | | |
|---|---|---|
| JP | 2003098991 A | 4/2003 |
| KR | 101719187 B1 | 3/2017 |

*Primary Examiner* — S M Sohel Imtiaz
(74) *Attorney, Agent, or Firm* — CANTOR COLBURN LLP (57) ABSTRACT

A display device of the invention includes pixels each connected to at least one of scan lines and at least one of emission lines, a scan driver providing scan signals to the scan lines, and an emission driver including stages connected to the emission lines, each of the stages providing an emission signal to a corresponding emission line. A first stage among the stages includes a first transistor including a first electrode connected to a first power source line, a second electrode connected to a first emission line, and a gate electrode connected to a first scan line, and a second transistor including a first electrode connected to a first node and a second electrode connected to the first emission line.

20 Claims, 10 Drawing Sheets

(56) References Cited

U.S. PATENT DOCUMENTS

| | | | |
|---|---|---|---|
| 2014/0055444 A1* | 2/2014 | Jang | G09G 3/3291 |
| | | | 345/213 |
| 2014/0111092 A1* | 4/2014 | Kim | G09G 3/3233 |
| | | | 315/127 |
| 2015/0170596 A1* | 6/2015 | Choi | G09G 3/3696 |
| | | | 345/212 |
| 2018/0211582 A1* | 7/2018 | Sakariya | G09G 3/2088 |
| 2019/0156733 A1* | 5/2019 | Park | H01L 27/1214 |
| 2019/0198565 A1* | 6/2019 | Lee | G09G 3/2003 |
| 2020/0202779 A1* | 6/2020 | Chang | G09G 3/3233 |

* cited by examiner

DISPLAY DEVICE

The application claims priority to Korean Patent Application No. 10-2020-0084732, filed Jul. 9, 2020, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

With the development of information technology, an importance of display devices, which are a connection medium between users and information, has been emphasized. In response to this, the use of display devices such as a liquid crystal display device, an organic light emitting display device, a plasma display device, and the like is increasing.

A display device displays an image by a combination of light emitted from a plurality of pixels. In order to write data to the pixels and control an emission time of the pixels, a scan driver and an emission driver are desired.

SUMMARY

When a scan driver and an emission driver are mounted on a display substrate, a dead space in which an image cannot be displayed increases.

A technical problem to be solved is to provide a display device capable of reducing a dead space by simplifying the configuration of an emission driver.

In addition, a technical problem to be solved is to provide a display device capable of preventing a flashing phenomenon during power-on.

A display device in an embodiment of the invention may include pixels each connected to at least one of scan lines and at least one of emission lines, a scan driver providing scan signals to the scan lines, and an emission driver including stages connected to the emission lines, each of the stages providing an emission signal to a corresponding emission line of the emission lines. A first stage among the stages may include a first transistor including a first electrode connected to a first power source line, a second electrode connected to a first emission line of the emission lines, and a gate electrode connected to a first scan line of the scan lines, and a second transistor including a first electrode connected to a first node and a second electrode connected to the first emission line.

In an embodiment, a gate electrode of the second transistor may be connected to the first electrode of the second transistor.

In an embodiment, the display device may further include a common resistor including a first electrode connected to the first node and a second electrode connected to a second power source line.

In an embodiment, the display device may further include a display substrate on which the pixels and the emission driver are disposed, and a circuit board on which the common resistor is disposed.

In an embodiment, the display device may further include a flexible circuit board electrically connecting the display substrate and the circuit board.

In an embodiment, a second stage among the stages may include a third transistor including a first electrode connected to the first power source line, a second electrode connected to a second emission line of the emission lines, and a gate electrode connected to a second scan line of the scan lines, and a fourth transistor including a first electrode connected to the first node and a second electrode connected to the second emission line, and a gate electrode of the fourth transistor may be connected to the first electrode of the fourth transistor.

In an embodiment, the first stage may further include a fifth transistor including a first electrode connected to the first power source line and a second electrode connected to the first emission line.

In an embodiment, the second stage may further include a sixth transistor including a first electrode connected to the first power source line, a second electrode connected to the second emission line, and a gate electrode connected to the first scan line.

In an embodiment, the scan driver may sequentially apply the scan signals of a turn-on level to the first scan line and the second scan line in each of a first frame period and a second frame period after the first frame period.

In an embodiment, the emission driver may maintain emission signals of a turn-off level in the first emission line and the second emission line during the first frame period and sequentially supply the emission signals of the turn-off level to the first emission line and the second emission line during the second frame period.

In an embodiment, the second power source line may be maintained at a voltage of a turn-off level during the first frame period and maintained at a voltage of a turn-on level during the second frame period.

In an embodiment, the first frame period may be a frame period immediately after the display device is powered on.

In an embodiment, the scan driver may sequentially supply a first scan signal and a second scan signal of a turn-on level to the first scan line and the second scan line during one frame period, and a period of the turn-on level of the first scan signal and a period of the turn-on level of the second scan signal may not overlap each other during the one frame period.

In an embodiment, during the one frame period, the second stage may apply the emission signal of a first turn-off level to the second emission line in synchronization with the first scan signal of the turn-on level and apply the emission signal of a second turn-off level to the second emission line in synchronization with the second scan signal of the turn-on level.

In an embodiment, the first to fourth transistors may be P-type transistors, and the pixels may include the P-type transistors.

In an embodiment, during a display period of the pixels, a voltage of the first power source line may be greater than a voltage of the second power source line.

In an embodiment, the first to fourth transistors may be N-type transistors, and the pixels may include the N-type transistors.

In an embodiment, during a display period of the pixels, a voltage of the first power source line may be less than a voltage of the second power source line.

In an embodiment, the first scan line, the second scan line, and the second emission line may be connected to a same pixel of the emission lines.

In an embodiment, a pixel of the pixels connected to the second scan line and the second emission line may be not connected to the first scan line.

BRIEF DESCRIPTION OF THE DRAWINGS

The accompanying drawings, which are included to provide a further understanding of the inventions, and are incorporated in and constitute a part of this specification, illustrate embodiments of the inventions, and, together with the description, serve to explain principles of the inventions.

DETAILED DESCRIPTION

Hereinafter, embodiments of the invention will be described in detail with reference to the accompanying drawings so that those skilled in the art may easily implement the invention. Embodiments of the invention may be embodied in various different forms and is not limited to the embodiments described herein.

In order to clearly describe the invention, parts that are not related to the description are omitted, and the same or similar components are denoted by the same reference numerals throughout the specification. Therefore, the above-mentioned reference numerals can be used in other drawings.

In addition, the size and thickness of each component shown in the drawings are arbitrarily shown for convenience of description, and thus the invention is not necessarily limited to those shown in the drawings. In the drawings, thicknesses may be exaggerated to clearly express the layers and regions.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 1:
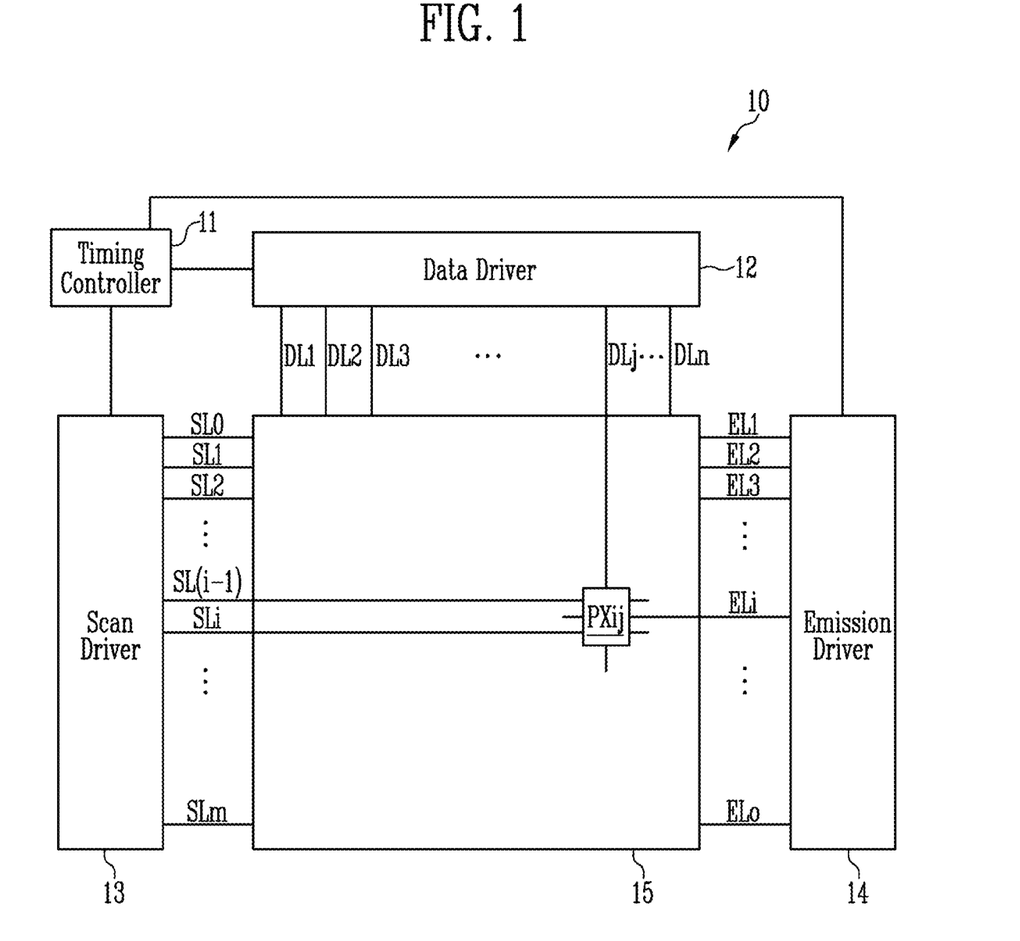
FIG. 1 is a block diagram for explaining an embodiment of a display device according to the invention.

FIG. 1 is a block diagram for explaining an embodiment of a display device according to the invention.

Referring to FIG. 1, a display device 10 in an embodiment of the invention may include a timing controller 11, a data driver 12, a scan driver 13, an emission driver 14, and a pixel unit 15.

The timing controller 11 may receive grayscales and control signals for each image frame from an external processor. The timing controller 11 may provide control signals suitable for each specification to the data driver 12, the scan driver 13, the emission driver 14, and the like to display an image corresponding to the image frame.

The timing controller 11 may render the grayscales to correspond to the specifications of the pixel unit 15. In an embodiment, the external processor may provide a red grayscale, a green grayscale, and a blue grayscale for each unit dot, for example. However, for example, when the pixel unit 15 has a pentile structure, since adjacent unit dots share pixels, the pixels may not correspond to each grayscale on a one-to-one basis. In this case, rendering of the grayscales may be desired. When the pixels correspond to each grayscale on a one-to-one basis, rendering of the grayscales may not be necessary.

The data driver 12 may generate data voltages to be provided to data lines DL1, DL2, DL3, DLj, and DLn using the grayscales that are rendered or not rendered and the control signals. In an embodiment, the data driver 12 may sample the grayscales using a clock signal and apply the data voltages corresponding to the grayscales to the data lines DL1 to DLn in units of pixel rows (for example, pixels connected to the same scan line). Here, j and n may be integers greater than 0, and j may be equal to or less than n.

The scan driver 13 may receive a clock signal, a scan start signal, and the like from the timing controller 11 to generate scan signals to be provided to scan lines SL0, SL1, SL2, SL(i−1), SLi, and SLm, where i and m may be integers greater than 0, and i may be equal to or less than m.

The scan driver 13 may provide the scan signals to the scan lines SL0 to SLm. In an embodiment, the scan driver 13 may sequentially supply the scan signals having a turn-on level pulse, for example. The scan driver 13 may include scan stages configured in the form of a shift register. The scan driver 13 may generate the scan signals by sequentially transferring the scan start signal in the form of a turn-on level pulse to a next scan stage under the control of the clock signal.

The emission driver 14 may include stages connected to emission lines EL1, EL2, EL3, ELi, and Elo, where o may be an integer greater than 0. Each of the stages may provide an emission signal to a corresponding emission line. In an embodiment, the emission driver 14 may sequentially provide emission signals having a turn-off level pulse to the emission lines EL1 to Elo, for example.

The pixel unit 15 may include a plurality of pixels. Each of the pixels may be connected to at least one of the scan lines SL0 to SLm and at least one of the emission lines EL1 to ELo. Also, each of the pixels may be connected to at least one data line. In an embodiment, in a pixel PXij, a scan input terminal may be connected to an i-th scan line SLi, and a data input terminal may be connected to a j-th data line DLj, for example.

Figure 2:
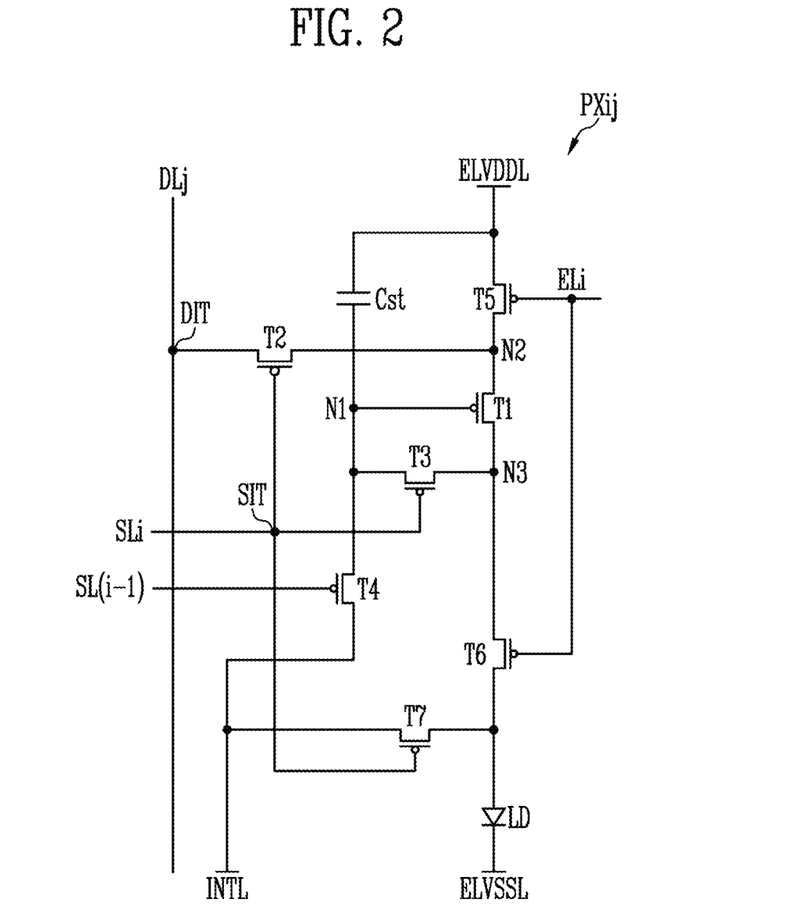
FIG. 2 is a circuit diagram for explaining an embodiment of a pixel according to the invention.

FIG. 2 is a circuit diagram for explaining an embodiment of a pixel according to the invention.

Referring to FIG. 2, a pixel PXij may include transistors T1, T2, T3, T4, T5, T6, and T7, a storage capacitor Cst, and a light emitting diode LD.

Hereinafter, a circuit including P-type transistors will be described as an example. However, those skilled in the art will be able to design a circuit including N-type transistors by varying the polarity of a voltage applied to a gate terminal. Similarly, those skilled in the art will be able to design a circuit including a combination of a P-type transistor and an N-type transistor. The P-type transistor may be a transistor in which the amount of current is increased by conducting when a voltage difference between a gate electrode and a source electrode increases in a negative direction. The N-type transistor may be a transistor in which the amount of current is increased by conducting when the voltage difference between the gate electrode and the source electrode increases in a positive direction. In an embodiment, the transistors may be configured in various forms such as a thin film transistor ("TFT"), a field effect transistor ("FET"), and a bipolar junction transistor ("BJT"), for example.

The transistor T1 may include a gate electrode connected to a node N1, a first electrode connected to a node N2, and a second electrode connected to a node N3. The transistor T1 may be also referred to as a driving transistor.

The transistor T2 may include a gate electrode connected to the i-th scan line SLi, a first electrode connected to the j-th data line DLj, and a second electrode connected to the node N2. The transistor T2 may be also referred to as a scan transistor. The first electrode of the transistor T2 may be a data input terminal DIT of the pixel PXij. Also, the gate electrode of the transistor T2 may be a scan input terminal SIT of the pixel PXij.

The transistor T3 may include a gate electrode connected to the i-th scan line SLi, a first electrode connected to the node N1, and a second electrode connected to the node N3. The transistor T3 may be also referred to as a diode-connected transistor.

The transistor T4 may include a gate electrode connected to an (i−1)th scan line SL(i−1), a first electrode connected to the node N1, and a second electrode connected to an initialization line INTL. In another embodiment, the gate electrode of the transistor T4 may be connected to another scan line. The transistor T4 may be also referred to as a gate initialization transistor.

The transistor T5 may include a gate electrode connected to an i-th emission line ELi, a first electrode connected to a first display power source line ELVDDL, and a second electrode connected to the node N2. The transistor T5 may be also referred to as an emission transistor. In another embodiment, the gate electrode of the transistor T5 may be connected to another emission line.

The transistor T6 may include a gate electrode connected to the i-th emission line ELi, a first electrode connected to the node N3, and a second electrode connected to an anode of the light emitting diode LD. The transistor T6 may be also referred to as an emission transistor. In another embodiment, the gate electrode of the transistor T6 may be connected to another emission line.

The transistor T7 may include a gate electrode connected to the i-th scan line SLi, a first electrode connected to the initialization line INTL, and a second electrode connected to the anode of the light emitting diode LD. The transistor T7 may be also referred to as an anode initialization transistor. In another embodiment, the gate electrode of the transistor T7 may be connected to another scan line. In an embodiment, the gate electrode of the transistor T7 may be connected to an (i+1)th scan line, for example.

A first electrode of the storage capacitor Cst may be connected to the first display power source line ELVDDL, and a second electrode of the storage capacitor Cst may be connected to the node N1.

The light emitting diode LD may include the anode connected to the second electrode of the transistor T6 and a cathode connected to a second display power source line ELVSSL. The light emitting diode LD may include an organic light emitting diode, an inorganic light emitting diode, a quantum dot/well light emitting diode, or the like.

Further, the light emitting diode LD may include a plurality of light emitting diodes connected in series, in parallel, or in series and parallel.

A first display power source voltage may be applied to the first display power source line ELVDDL, a second display power source voltage may be applied to the second display power source line ELVSSL, and an initialization voltage may be applied to the initialization line INTL. In an embodiment, during a display period of the display device 10, the first display power source voltage may be greater than the second display power source voltage, for example. In an embodiment, the initialization voltage may be equal to or greater than the second display power source voltage, for example. In an embodiment, the initialization voltage may correspond to a data voltage having the smallest size among data voltages that may be provided, for example. In an embodiment, the size of the initialization voltage may be smaller than the sizes of the data voltages that may be provided, for example.

Figure 3:
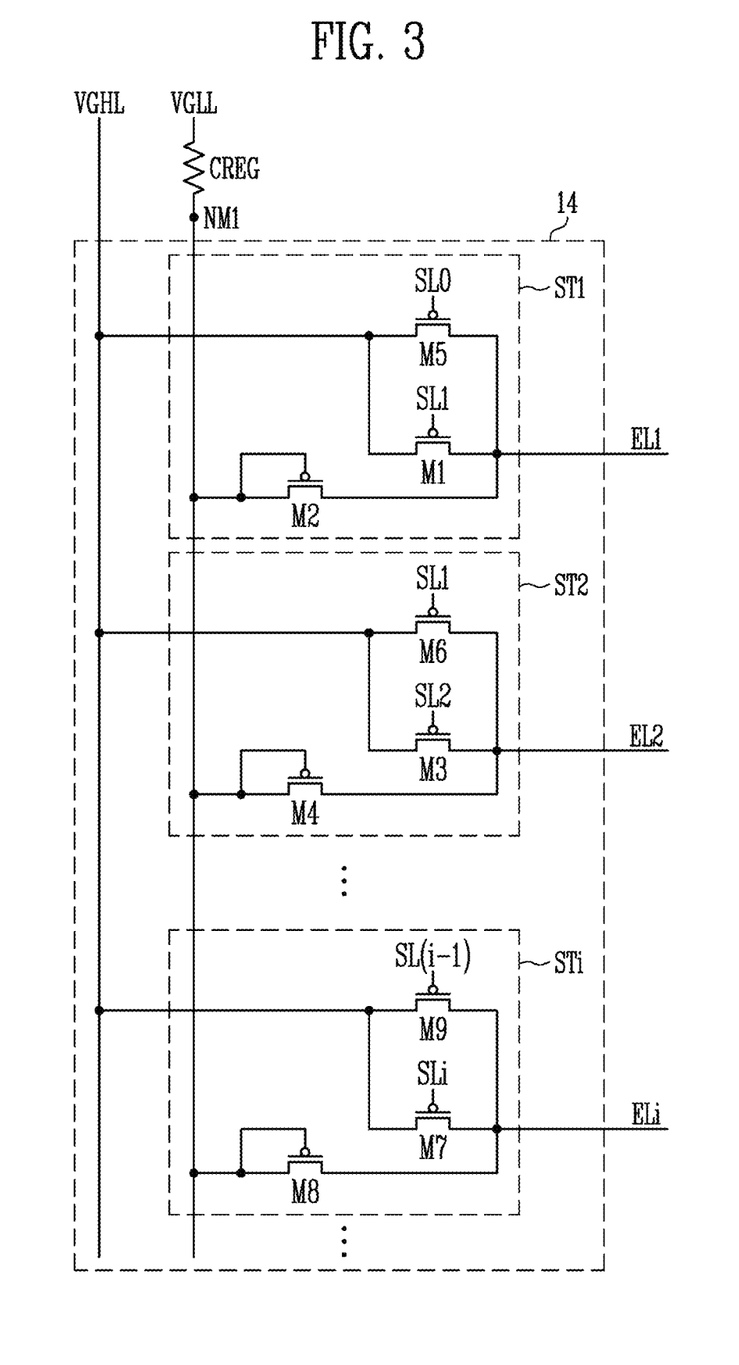
FIG. 3 is a circuit diagram for explaining an embodiment of an emission driver according to the invention.

FIG. 3 is a circuit diagram for explaining an embodiment of an emission driver according to the invention.

Referring to FIG. 3, the emission driver 14 in an embodiment of the invention may include a plurality of stages ST1, ST2, and STi.

In an embodiment, a first stage ST1 may include a first transistor M1, a second transistor M2, and a fifth transistor M5, for example.

The first transistor M1 may include a first electrode connected to a first power source line VGHL, a second electrode connected to a first emission line EL1, and a gate electrode connected to a first scan line SL1.

The second transistor M2 may include a first electrode connected to a first node NM1 and a second electrode connected to the first emission line EL1. A gate electrode of the second transistor M2 may be connected to the first electrode of the second transistor M2. That is, the second transistor M2 may be connected in the form of a diode. In an embodiment, the second transistor M2 may be replaced with a diode.

The fifth transistor M5 may include a first electrode connected to the first power source line VGHL and a second electrode connected to the first emission line EL1. A gate electrode of the fifth transistor M5 may be connected to a scan line SL0.

In an embodiment, a second stage ST2 may include a third transistor M3, a fourth transistor M4, and a sixth transistor M6, for example.

The third transistor M3 may include a first electrode connected to the first power source line VGHL, a second electrode connected to a second emission line EL2, and a gate electrode connected to a second scan line SL2.

The fourth transistor M4 may include a first electrode connected to the first node NM1 and a second electrode connected to the second emission line EL2. A gate electrode of the fourth transistor M4 may be connected to the first electrode of the fourth transistor M4. That is, the fourth transistor M4 may be connected in the form of a diode. In an embodiment, the fourth transistor M4 may be replaced with a diode.

The sixth transistor M6 may include a first electrode connected to the first power source line VGHL, a second electrode connected to the second emission line EL2, and a gate electrode connected to the first scan line SL1.

In an embodiment, an i-th stage STi may include a seventh transistor M7, an eighth transistor M8, and a ninth transistor M9, for example.

The seventh transistor M7 may include a first electrode connected to the first power source line VGHL, a second electrode connected to the i-th emission line ELi, and a gate electrode connected to the i-th scan line SLi.

The eighth transistor M8 may include a first electrode connected to the first node NM1 and a second electrode connected to the i-th emission line ELi. A gate electrode of the eighth transistor M8 may be connected to the first electrode of the eighth transistor M8. That is, the eighth transistor M8 may be connected in the form of a diode. In an embodiment, the eighth transistor M8 may be replaced with a diode.

The ninth transistor M9 may include a first electrode connected to the first power source line VGHL, a second electrode connected to the i-th emission line ELi, and a gate electrode connected to the (i−1)th scan line SL(i−1).

The display device 10 may include a common resistor CREG in which a first electrode is connected to the first node NM1 and a second electrode is connected to a second power source line VGLL. The stages ST1, ST2, and STi may be commonly connected to the common resistor CREG through the first node NM1. The common resistor CREG may be a resistor having a high resistance value and desire a large area to be disposed (e.g., mounted). Therefore, it may be preferable that the common resistor CREG is disposed outside the emission driver 14.

In the illustrated embodiment, since each of the stages ST1, ST2, and STi includes three transistors and a separate clock signal is not desired, the configuration thereof may be simplified. Thus, a dead space may be reduced.

Figure 4:
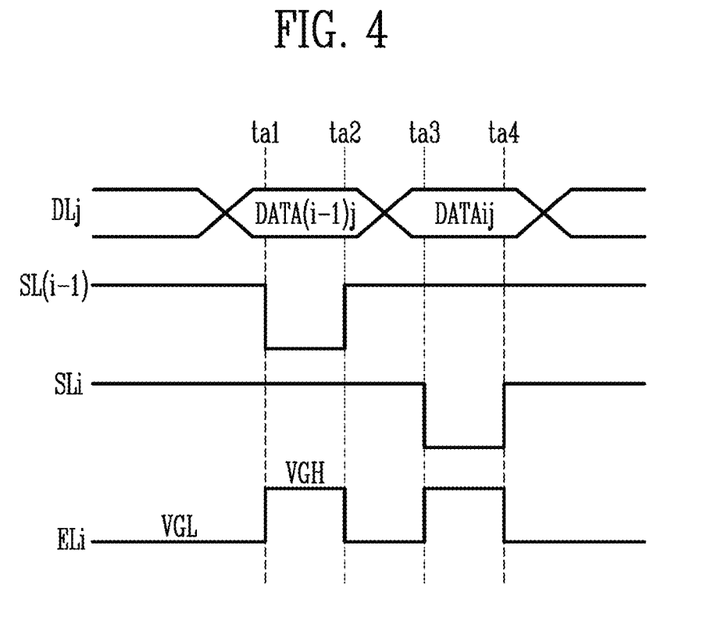
FIG. 4 is a timing diagram for explaining an embodiment of the emission driver and a driving method of the pixel according to the invention.

FIG. 4 is a timing diagram for explaining an embodiment of the emission driver and a driving method of the pixel according to the invention.

The scan driver 13 may sequentially supply an (i−1)th scan signal and an i-th scan signal of a turn-on level to the (i−1)th scan line SL(i−1) and the i-th scan line SLi during one frame period. During one frame period, a period ta1 to ta2 of the turn-on level of the (i−1)th scan signal and a period ta3 to ta4 of the turn-on level of the i-th scan signal may not overlap each other.

During one frame period, the i-th stage STi of the emission driver 14 may apply the emission signal of a first turn-off level to the i-th emission line ELi in synchronization with the (i−1)th scan signal of the turn-on level (ta1 to ta2) and apply the emission signal of a second turn-off level to the i-th emission line ELi in synchronization with the i-th scan signal of the turn-on level (ta3 to ta4).

Specifically, at a time point ta1, a data voltage DATA(i−1)j for an (i−1)th pixel may be applied to the j-th data line DLj, and the scan signal of the turn-on level (logic low level) may be applied to the (i−1)th scan line SL(i−1).

At this time, since the scan signal of a turn-off level (logic high level) is applied to the i-th scan line SLi, the transistor T2 may be in a turned-off state, and the data voltage DATA(i−1)j for the (i−1)th pixel may be prevented from being written to the pixel PXij. Since the transistor T4 is in a turned-on state, the node N1 may be connected to the initialization line INTL, and a voltage of the node N1 may be initialized.

At this time, since the ninth transistor M9 of the i-th stage STi is turned on, a first power source voltage VGH of the first power source line VGHL may be applied to the i-th emission line ELi. During the display period of the display device 10, the first power source voltage VGH may be at a turn-off level (logic high level). Accordingly, since the emission signal of the turn-off level is applied to the i-th emission line ELi, the transistors T5 and T6 may be in the turned-off state and unnecessary light emission of the light emitting diode LD due to the process of applying the initialization voltage may be prevented.

At this time, the first node NM1 may be charged with the first power source voltage VGH through the ninth transistor M9 and the eighth transistor M8. However, the other emission lines EL1 and EL2 may be maintained at the turn-on level (logic low level) due to the transistors M2 and M4 connected in the form of the diode.

At a time point ta2, the scan signal of the turn-off level may be applied to the (i−1)th scan line SL(i−1), and the ninth transistor M9 of the i-th stage STi may be turned off. Accordingly, the i-th emission line ELi and the first node NM1 in a floating state may be connected to the second power source line VGLL and charged with a second power source voltage VGL. During the display period of the display device 10, the second power source voltage VGL may be at a turn-on level (logic low level).

At a time point ta3, a data voltage DATAij for an i-th pixel PXij may be applied to the j-th data line DLj and the scan signal of the turn-on level may be applied to the i-th scan line SLi. Accordingly, the transistors T2, T1, and T3 may be in a conductive state, and the j-th data line DLj and the node N1 may be electrically connected. Accordingly, a compensation voltage obtained by subtracting a threshold voltage of the transistor T1 from the data voltage DATAij may be applied to the second electrode (that is, the node N1) of the storage capacitor Cst, and the storage capacitor Cst may maintain a voltage corresponding to a difference between the first power source voltage and the compensation voltage. This period may be also referred to as a threshold voltage compensation period.

At this time, since the transistor T7 is in the turned-on state, the anode of the light emitting diode LD and the initialization line INTL may be connected, and the light emitting diode LD may be initialized with the amount of charge corresponding to a voltage difference between the initialization voltage and the second power source voltage.

At this time, since the seventh transistor M7 of the i-th stage STi is turned on, the first power source voltage VGH of the first power source line VGHL may be applied to the i-th emission line ELi. Accordingly, since the emission signal of the turn-off level is applied to the emission line ELi, the transistors T5 and T6 may be in the turned-off state, and unnecessary light emission of the light emitting diode LD due to the process of compensating for the threshold voltage may be prevented.

At this time, the first node NM1 may be charged with the first power source voltage VGH through the seventh transistor M7 and the eighth transistor M8. However, the other emission lines EL1 and EL2 may be maintained at the turn-on level due to the transistors M2 and M4 connected in the form of the diode.

At a time point ta4, the scan signal of the turn-off level may be applied to the i-th scan line SLi, and the seventh transistor M7 of the i-th stage STi may be turned off. Accordingly, the i-th emission line ELi and the first node NM1 in the floating state may be connected to the second power source line VGLL and charged with the second power source voltage VGL.

As the emission signal of the turn-on level is applied to the emission line ELi, the transistors T5 and T6 may be in the conductive state. Accordingly, a driving current path passing through the first display power source line ELVDDL, the transistor T5, the transistor T1, the transistor T6, the light emitting diode LD, and the second display power source line ELVSSL may be provided.

The amount of driving current flowing through the first electrode and the second electrode of the transistor T1 may be controlled according to the voltage maintained in the storage capacitor Cst. The light emitting diode LD may emit light with a luminance corresponding to the amount of driving current.

Figure 5:
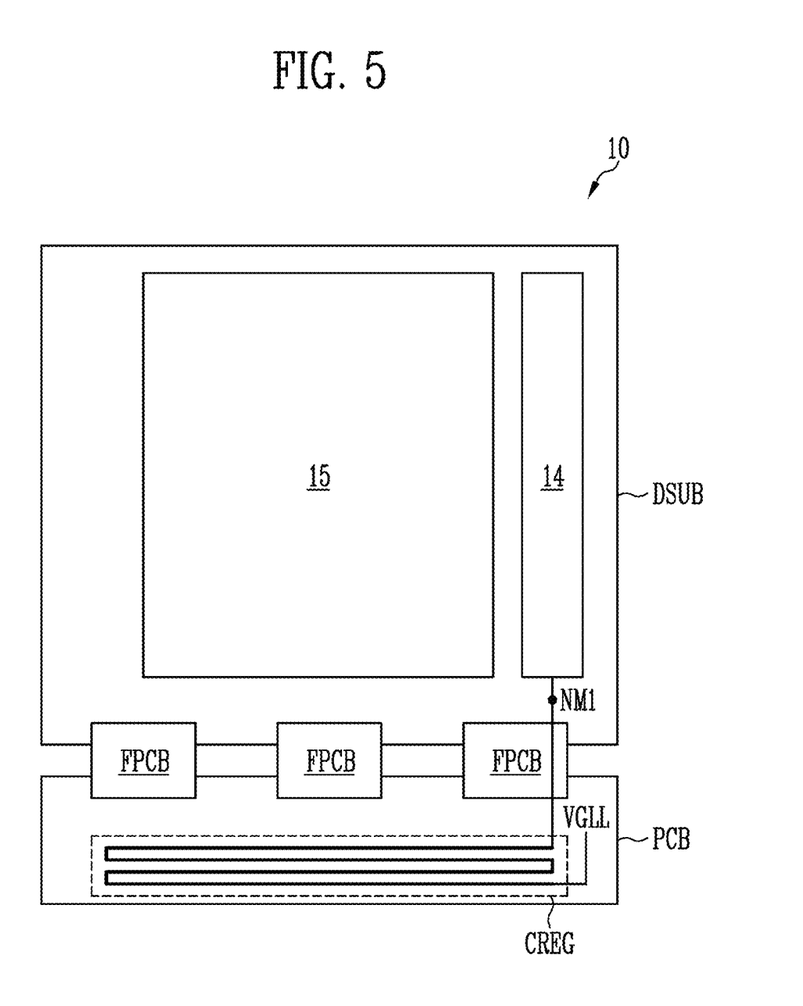
FIG. 5 is a diagram for explaining an embodiment of a display substrate, a flexible circuit board, and a circuit board according to the invention.

FIG. 5 is a diagram for explaining an embodiment of a display substrate, a flexible circuit board, and a circuit board according to the invention.

Referring to FIG. 5, the display device 10 in an embodiment of the invention may include a display substrate DSUB, at least one flexible circuit board FPCB, and a circuit board PCB.

The pixels of the pixel unit 15 and the emission driver 14 may be disposed on the display substrate DSUB. FIG. 5 shows an example in which the emission driver 14 is disposed in a first side (for example, the right side) of the pixel unit 15. In another embodiment, the emission driver 14 may be disposed in a second side (for example, the left side) opposite to the first direction of the pixel unit 15, or may be disposed on both sides of the pixel unit 15. The display substrate DSUB may be rigid or flexible.

The common resistor CREG may be disposed on the circuit board PCB. As described above, the common resistor CREG may be the resistor having the high resistance value and occupy the large area. When the common resistor CREG is disposed (e.g., mounted) on the display substrate DSUB, the dead space may be greatly increased. Therefore, it may be preferable that the common resistor CREG is disposed (e.g., mounted) on the circuit board PCB. The circuit board PCB may be rigid or flexible.

The flexible circuit board FPCB may electrically connect the display substrate DSUB and the circuit board PCB. In an embodiment, pads of the display substrate DSUB may contact pads of the flexible circuit board FPCB, for example. In an embodiment, pads of the circuit board PCB may contact other pads of the flexible circuit board FPCB. In an embodiment, the flexible circuit board FPCB may be configured in the form of a chip on film ("COF"), for example.

Although not shown in FIG. 5, the scan driver 13 may be disposed on the display substrate DSUB, and the data driver 12 and the timing controller 11 may be disposed on the flexible circuit board FPCB or the circuit board PCB. A power supply unit (not shown) that supplies power source to the first power source line VGHL and the second power source line VGLL may be disposed on the flexible circuit board FPCB or the circuit board PCB.

Since the flexible circuit board FPCB may be folded, the circuit board PCB may be disposed on a rear surface of the display substrate DSUB (that is, a surface opposite to a front surface on which the pixel unit 15 is disposed). Accordingly, the area occupied by the common resistor CREG may not be included in the dead space.

Figure 6:
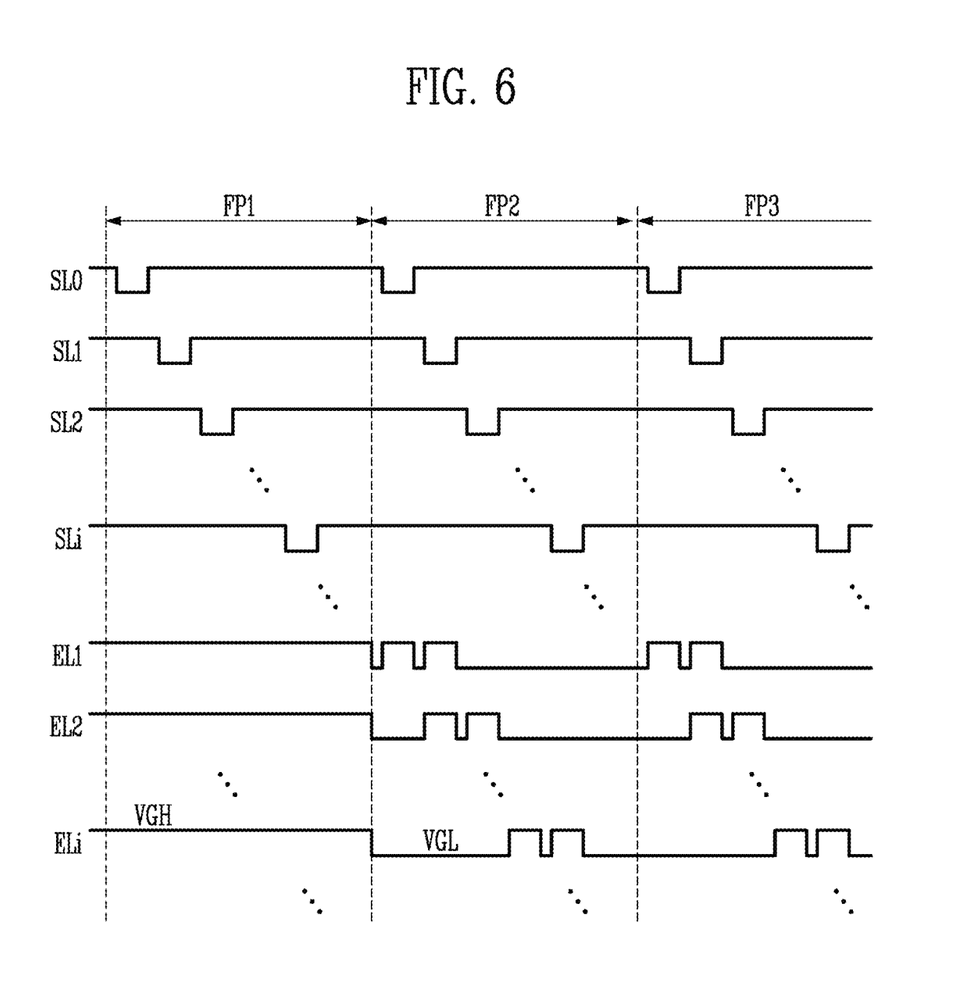
FIG. 6 is a timing diagram for explaining an embodiment of a driving method of the display device according to the invention.

FIG. 6 is a timing diagram for explaining an embodiment of a driving method of the display device according to the invention.

Referring to FIG. 6, a plurality of frame periods FP1, FP2, and FP3 is shown as an example. In each of the frame periods FP1, FP2, and FP3, data corresponding to one image frame may be written to the pixel unit 15.

In the illustrated embodiment, it is assumed that a first frame period FP1 is a frame period immediately after the display device 10 is powered on. A second frame period FP2 may be a frame period after the first frame period FP1.

The scan driver 13 may sequentially apply the scan signals of the turn-on level to the scan lines SL0, SL1, SL2, and SLi in each frame period.

The emission driver 14 may maintain the emission signals of the turn-off level in the emission lines EL1, EL2, and ELi during the first frame period FP1. In this case, the second power source line VGLL may be maintained at a voltage of the turn-off level during the first frame period FP1. In an embodiment, the voltage of the turn-off level may be the same as or similar to the first power source voltage VGH of the first power source line VGHL, for example. During the first frame period FP1, since both the first power source line VGHL and the second power source line VGLL are maintained at the voltage of the turn-off level, the stages ST1, ST2, and STi of the emission driver 14 may maintain the emission signals of the turn-off level despite the operation of the transistors.

Immediately after the display device 10 is powered on, the amount of charge in each node of the display device 10 may be in an uncertain state. Accordingly, by preventing light emission of the pixel unit 15 in at least one frame period FP1 immediately after the display device 10 is powered on, a flashing phenomenon may be prevented. In the illustrated embodiment, the light emission of the pixel unit 15 is prevented in only one frame period FP1. However, in another embodiment, the light emission of the pixel unit 15 may be prevented in two or more frame periods.

When the second frame period FP2 starts, a voltage of the second power source line VGLL may be changed to the second power source voltage VGL, and the emission signals of the emission lines EL1, EL2, and ELi may be initialized to the second power source voltage VGL. The second power source line VGLL may be maintained at a voltage of the turn-on level (for example, the second power source voltage VGL) during the second frame period FP2.

The emission driver 14 may sequentially supply the emission signals of the turn-off level to the emission lines EL1, EL2, and ELi during the second frame period FP2 (refer to the descriptions of FIGS. 3 and 4).

Since an operation of the emission driver 14 in a third frame period FP3 is the same as the operation in the second frame period FP2, duplicate descriptions will be omitted.

In the embodiments of FIGS. 1 to 6, the transistors of the emission driver 14 may be the P-type transistors, and each of the pixels of the pixel unit 15 may include the P-type transistors. Accordingly, during display periods FP2 and FP3 of the pixels, the first power source voltage VGH of the first power source line VGHL may be greater than the second power source voltage VGL of the second power source line VGLL.

Figure 7:
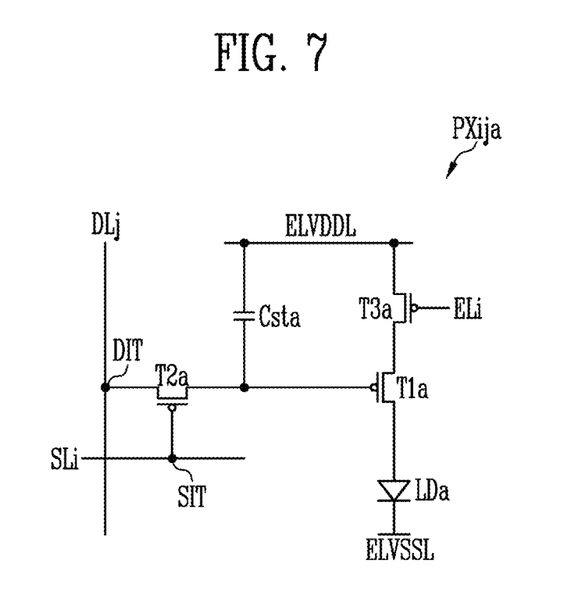
FIG. 7 is a circuit diagram for explaining another embodiment of a pixel according to the invention.

FIG. 7 is a circuit diagram for explaining another embodiment of a pixel according to the invention.

Referring to FIG. 7, a pixel PXija in another embodiment of the invention may include transistors T1a, T2a, and T3a, a storage capacitor Csta, and a light emitting diode LDa.

The transistor T1a may include a gate electrode connected to a second electrode of the storage capacitor Csta, a first electrode connected to a second electrode of the transistor T3a, and a second electrode connected to an anode of the light emitting diode LDa. The transistor T1a may be also referred to as a driving transistor.

The transistor T2a may include a gate electrode connected to the i-th scan line SLi, a first electrode connected to the j-th data line DLj, and a second electrode connected to the second electrode of the storage capacitor Csta. The transistor T2a may be also referred to as a scan transistor. The first electrode of the transistor T2a may be the data input terminal DIT of the pixel PXija. Also, the gate electrode of the transistor T2a may be the scan input terminal SIT of the pixel PXija.

The transistor T3a may include a gate electrode connected to the i-th emission line ELi, a first electrode connected to the first display power source line ELVDDL, and a second electrode connected to the first electrode of the transistor T1a. The transistor T3a may be also referred to as an emission transistor.

A first electrode of the storage capacitor Csta may be connected to the first display power source line ELVDDL, and the second electrode of the storage capacitor Csta may be connected to the gate electrode of the transistor T1a.

The light emitting diode LDa may include the anode connected to the second electrode of the transistor T1a and a cathode connected to the second display power source line ELVSSL. During an emission period of the light emitting diode LDa, the first display power source voltage applied to the first display power source line ELVDDL may be greater than the second display power source voltage applied to the second display power source line ELVSSL.

In FIG. 2, the (i−1)th scan line SL(i−1), the i-th scan line SLi, and the i-th emission line ELi are connected to the same pixel PXij. In contrast, in FIG. 7, the pixel PXija connected to the i-th scan line SLi and the i-th emission line ELi is not connected to the (i−1)th scan line SL(i−1).

Figure 8:
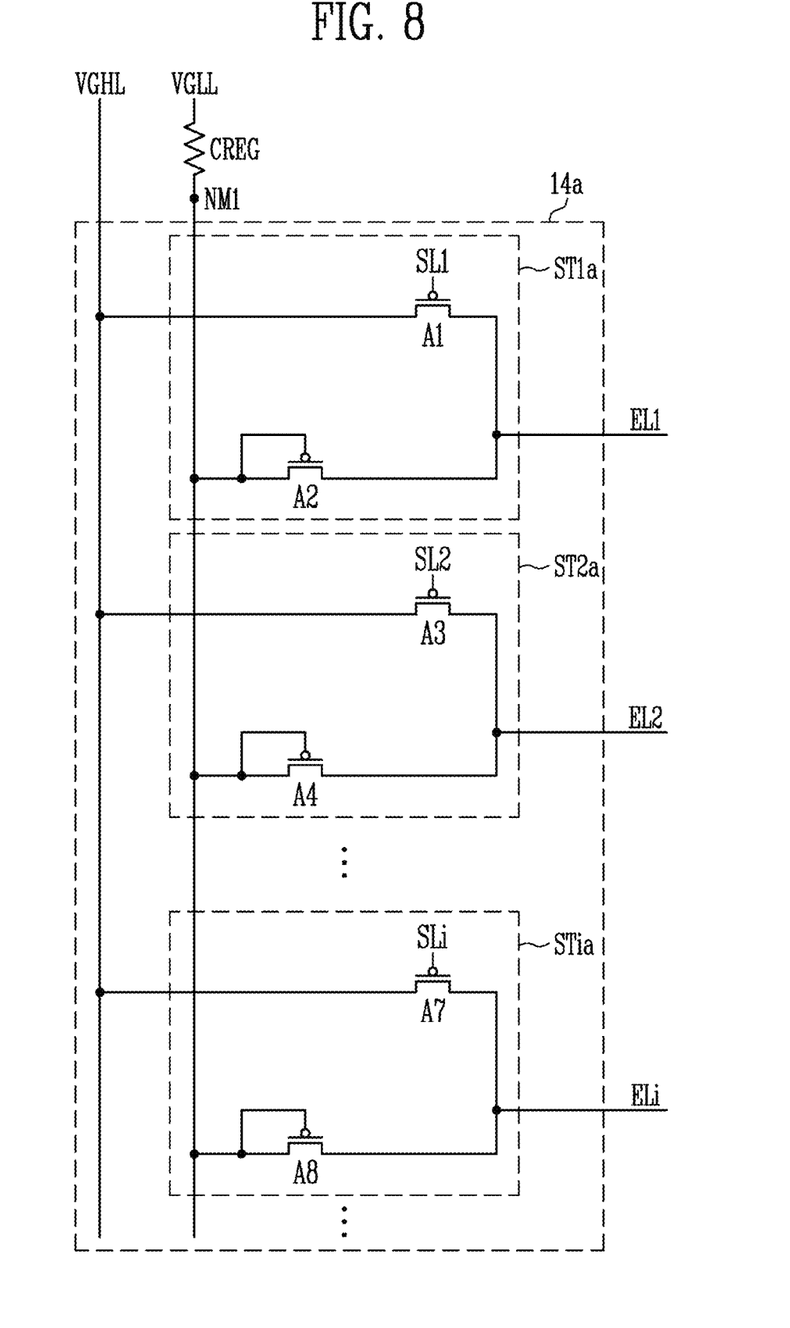
FIG. 8 is a circuit diagram for explaining another embodiment of an emission driver according to the invention.

FIG. 8 is a circuit diagram for explaining an emission driver according to the invention.

Referring to FIG. 8, an emission driver 14a may include a plurality of stages ST1a, ST2a, and STia.

In an embodiment, a first stage ST1a may include a first transistor A1 and a second transistor A2, for example.

The first transistor A1 may include a first electrode connected to the first power source line VGHL, a second electrode connected to the first emission line EL1, and a gate electrode connected to the first scan line SL1.

The second transistor A2 may include a first electrode connected to the first node NM1 and a second electrode connected to the first emission line EL1. A gate electrode of the second transistor A2 may be connected to the first electrode of the second transistor A2. That is, the second transistor A2 may be connected in the form of a diode. In an embodiment, the second transistor A2 may be replaced with a diode.

In an embodiment, a second stage ST2a may include a third transistor A3 and a fourth transistor A4, for example.

The third transistor A3 may include a first electrode connected to the first power source line VGHL, a second electrode connected to the second emission line EL2, and a gate electrode connected to the second scan line SL2.

The fourth transistor A4 may include a first electrode connected to the first node NM1 and a second electrode connected to the second emission line EL2. A gate electrode of the fourth transistor A4 may be connected to the first electrode of the fourth transistor A4. That is, the fourth transistor A4 may be connected in the form of a diode. In an embodiment, the fourth transistor A4 may be replaced with a diode.

In an embodiment, an i-th stage STia may include a seventh transistor A7 and an eighth transistor A8, for example.

The seventh transistor A7 may include a first electrode connected to the first power source line VGHL, a second electrode connected to the i-th emission line ELi, and a gate electrode connected to the i-th scan line SLi.

The eighth transistor A8 may include a first electrode connected to the first node NM1 and a second electrode connected to the i-th emission line ELi. A gate electrode of the eighth transistor A8 may be connected to the first electrode of the eighth transistor A8. That is, the eighth transistor A8 may be connected in the form of a diode. In an embodiment, the eighth transistor A8 may be replaced with a diode.

The display device 10 may include the common resistor CREG in which the first electrode is connected to the first node NM1 and the second electrode is connected to the second power source line VGLL. The stages ST1a, ST2a, and STia may be commonly connected to the common resistor CREG through the first node NM1.

In the illustrated embodiment, since each of the stages ST1a, ST2a, and STia includes two transistors and a separate clock signal is not desired, the configuration thereof may be simplified. Thus, the dead space may be reduced.

The pixel PXija of FIG. 7 and the emission driver 14a of FIG. 8 may be driven in the same manner as the driving method of FIG. 4 except that the previous scan signal (for example, the (i−1)th scan signal) is not received. In an embodiment, the driving method in the period ta3 to ta4 of FIG. 4 may be applied to the pixel PXija of FIG. 7 and the emission driver 14a of FIG. 8. Therefore, duplicate descriptions are omitted, for example.

Figure 9:
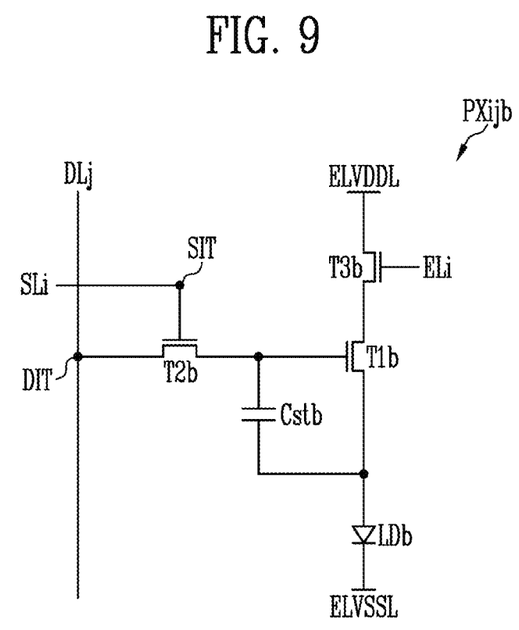
FIG. 9 is a circuit diagram for explaining another embodiment of a pixel according to the invention.

FIG. 9 is a circuit diagram for explaining another embodiment of a pixel according to the invention.

Referring to FIG. 9, a pixel PXijb may include transistors T1b, T2b, and T3b, a storage capacitor Cstb, and a light emitting diode LDb.

The transistor T1b may include a gate electrode connected to a first electrode of the storage capacitor Cstb, a first electrode connected to a second electrode of the transistor T3b, and a second electrode connected to a second electrode of the storage capacitor Cstb. The transistor T1b may be also referred to as a driving transistor.

The transistor T2b may include a gate electrode connected to the i-th scan line SLi, a first electrode connected to the j-th data line DLj, and a second electrode connected to the gate electrode of the transistor T1b. The transistor T2b may be also referred to as a scan transistor. The first electrode of the transistor T2b may be the data input terminal DIT of the pixel PXijb. Also, the gate electrode of the transistor T2b may be the scan input terminal SIT of the pixel PXijb.

The transistor T3b may include a gate electrode connected to the i-th emission line ELi, a first electrode connected to the first display power source line ELVDDL, and a second electrode connected to the first electrode of the transistor T1b. The transistor T3b may be also referred to as an emission transistor.

The first electrode of the storage capacitor Cstb may be connected to the gate electrode of the transistor T1b, and the second electrode of the storage capacitor Cstb may be connected to the second electrode of the transistor T1b.

The light emitting diode LDb may include an anode connected to the second electrode of the transistor T1b and a cathode connected to the second display power source line ELVSSL. During the emission period of the light emitting diode LDb, the first display power source voltage applied to the first display power source line ELVDDL may be greater than the second display power source voltage applied to the second display power source line ELVSSL.

Figure 10:
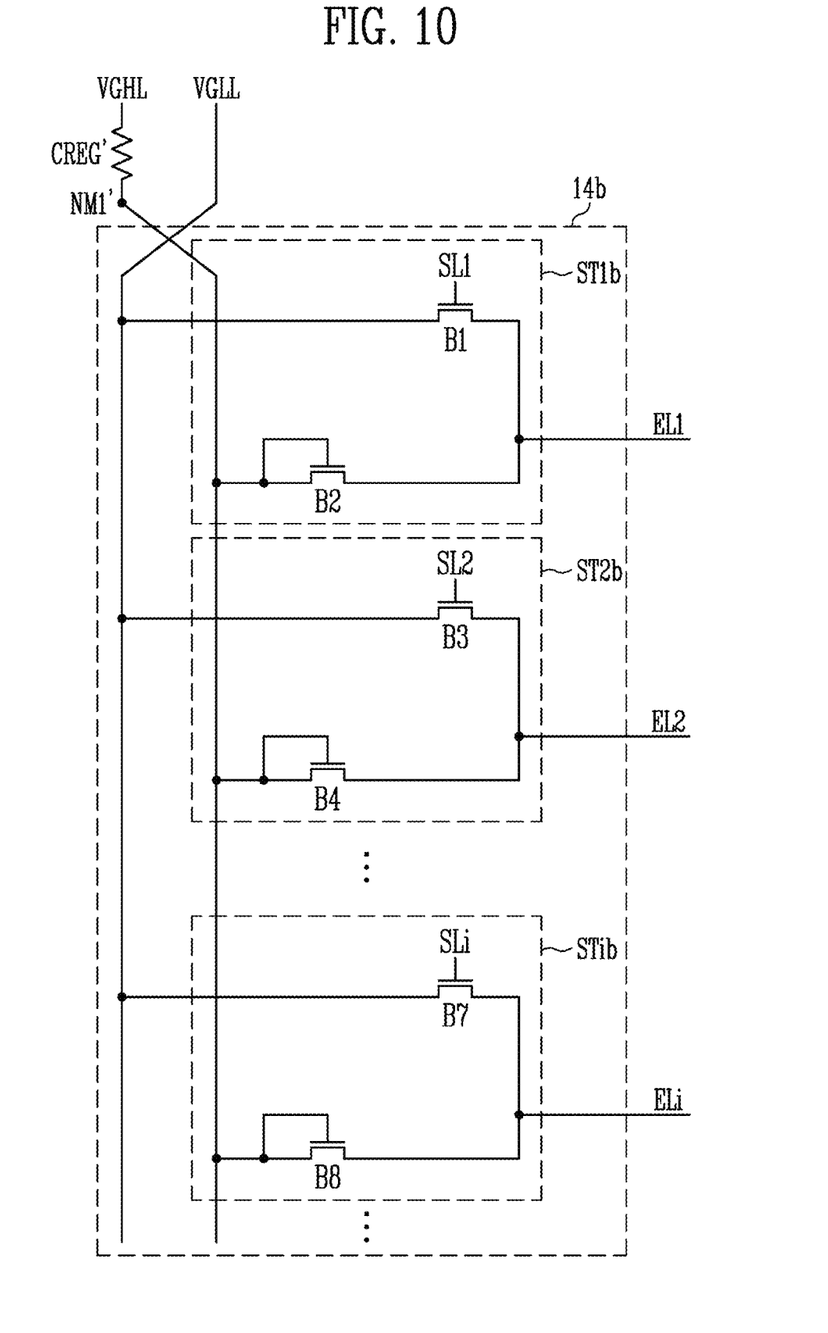
FIG. 10 is a diagram for explaining another embodiment of an emission driver according to the invention.

FIG. 10 is a diagram for explaining another embodiment of an emission driver according to the invention.

Referring to FIG. 10, an emission driver 14b may include a plurality of stages ST1b, ST2b, and STib.

In an embodiment, a first stage ST1b may include a first transistor B1 and a second transistor B2, for example.

The first transistor B1 may include a first electrode connected to the first power source line VGLL, a second electrode connected to the first emission line EL1, and a gate electrode connected to the first scan line SL1.

The second transistor B2 may include a first electrode connected to a first node NM1' and a second electrode connected to the first emission line EL1. A gate electrode of the second transistor B2 may be connected to the first electrode of the second transistor B2. That is, the second transistor B2 may be connected in the form of a diode. In an embodiment, the second transistor B2 may be replaced with a diode.

In an embodiment, a second stage ST2b may include a third transistor B3 and a fourth transistor B4, for example.

The third transistor B3 may include a first electrode connected to the first power source line VGLL, a second electrode connected to the second emission line EL2, and a gate electrode connected to the second scan line SL2.

The fourth transistor B4 may include a first electrode connected to the first node NM1' and a second electrode connected to the second emission line EL2. A gate electrode of the fourth transistor B4 may be connected to the first electrode of the fourth transistor B4. That is, the fourth transistor B4 may be connected in the form of a diode. In an embodiment, the fourth transistor B4 may be replaced with a diode.

In an embodiment, an i-th stage STib may include a seventh transistor B7 and an eighth transistor B8, for example.

The seventh transistor B7 may include a first electrode connected to the first power source line VGLL, a second electrode connected to the i-th emission line ELi, and a gate electrode connected to the i-th scan line SLi.

The eighth transistor B8 may include a first electrode connected to the first node NM1' and a second electrode connected to the i-th emission line ELi. A gate electrode of the eighth transistor B8 may be connected to the first electrode of the eighth transistor B8. That is, the eighth transistor B8 may be connected in the form of a diode. In an embodiment, the eighth transistor B8 may be replaced with a diode.

The display device 10 may include a common resistor CREG' in which a first electrode is connected to the first node NM1' and a second electrode is connected to the second power source line VGHL. The stages ST1b, ST2b, and STib may be commonly connected to the common resistor CREG' through the first node NM1'.

In the illustrated embodiment, since each of the stages ST1b, ST2b, and STib includes two transistors and a separate clock signal is not desired, the configuration thereof may be simplified. Thus, the dead space may be reduced.

The pixel PXijb of FIG. 9 and the emission driver 14b of FIG. 10 are substantially the same as the pixel PXija of FIG. 7 and the emission driver 14a of FIG. 8 except that the pixel PXijb and the emission driver 14b include the N-type transistors. Accordingly, the pixel PXijb and the emission driver 14b may be driven in the same manner as the pixel PXija and the emission driver 14a, except that the turn-on level and the turn-off level are opposite to each other. Therefore, a detailed description of the driving method is omitted.

In the embodiments of FIGS. 9 and 10, the transistors of the emission driver 14b are N-type transistors, and each of the pixels of the pixel unit 15 includes the N-type transistors. Accordingly, during the display period of the pixels, the first power source voltage VGL of the first power source line VGLL may be less than the second power source voltage VGH of the second power source line VGHL.

The display device according to the invention may reduce the dead space by simplifying the configuration of the emission driver.

In addition, the display device according to the invention may prevent the flashing phenomenon during power-on.

The drawings referred to heretofore and the detailed description of the invention described above are merely illustrative of the invention. It is to be understood that the invention has been disclosed for illustrative purposes only and is not intended to limit the meaning or scope of the invention. Therefore, those skilled in the art will appreciate that various modifications and equivalent embodiments are possible.

What is claimed is:

1. A display device comprising:
   pixels each connected to at least one of scan lines and at least one of emission lines;
   a scan driver providing scan signals to the scan lines; and
   an emission driver including stages connected to the emission lines, each of the stages providing an emission signal to a corresponding emission line of the emission lines, a first stage among the stages including:
      a first transistor including:
         a first electrode connected to a first power source line;
         a second electrode connected to a first emission line of the emission lines; and
         a gate electrode connected to a first scan line of the scan lines; and
      a second transistor including:
         a first electrode connected to a first node; and
         a second electrode connected to the first emission line.

2. The display device of claim 1, wherein a gate electrode of the second transistor is connected to the first electrode of the second transistor.

3. The display device of claim 2, further comprising:
   a common resistor including a first electrode connected to the first node and a second electrode connected to a second power source line.

4. The display device of claim 3, further comprising:
   a display substrate on which the pixels and the emission driver are disposed; and
   a circuit board on which the common resistor is disposed.

5. The display device of claim 4, further comprising:
   a flexible circuit board electrically connecting the display substrate and the circuit board.

6. The display device of claim 3, wherein a second stage among the stages includes:
   a third transistor including a first electrode connected to the first power source line, a second electrode connected to a second emission line of the emission lines, and a gate electrode connected to a second scan line of the scan lines; and
   a fourth transistor including a first electrode connected to the first node and a second electrode connected to the second emission line, and
   wherein a gate electrode of the fourth transistor is connected to the first electrode of the fourth transistor.

7. The display device of claim 6, wherein the first stage further includes a fifth transistor including a first electrode connected to the first power source line and a second electrode connected to the first emission line.

8. The display device of claim 7, wherein the second stage further includes a sixth transistor including a first electrode connected to the first power source line, a second electrode connected to the second emission line, and a gate electrode connected to the first scan line.

9. The display device of claim 8, wherein the scan driver sequentially applies the scan signals of a turn-on level to the first scan line and the second scan line in each of a first frame period and a second frame period after the first frame period.

10. The display device of claim 9, wherein the emission driver maintains emission signals of a turn-off level in the first emission line and the second emission line during the first frame period and sequentially supplies the emission signals of the turn-off level to the first emission line and the second emission line during the second frame period.

11. The display device of claim 10, wherein the second power source line is maintained at a voltage of a turn-off level during the first frame period and maintained at a voltage of a turn-on level during the second frame period.

12. The display device of claim 11, wherein the first frame period is a frame period immediately after the display device is powered on.

13. The display device of claim 8, wherein the scan driver sequentially supplies a first scan signal and a second scan signal of a turn-on level to the first scan line and the second scan line during one frame period, and
   wherein a period of the turn-on level of the first scan signal and a period of the turn-on level of the second scan signal do not overlap each other during the one frame period.

14. The display device of claim 13, wherein the second stage applies the emission signal of a first turn-off level to the second emission line in synchronization with the first scan signal of the turn-on level and applies the emission signal of a second turn-off level to the second emission line in synchronization with the second scan signal of the turn-on level during the one frame period.

15. The display device of claim 6, wherein the first to fourth transistors are P-type transistors, and
   wherein the pixels include the P-type transistors.

16. The display device of claim 15, wherein a voltage of the first power source line is greater than a voltage of the second power source line during a display period of the pixels.

17. The display device of claim 6, wherein the first to fourth transistors are N-type transistors, and
   wherein the pixels include the N-type transistors.

18. The display device of claim 17, wherein a voltage of the first power source line is less than a voltage of the second power source line during a display period of the pixels.

19. The display device of claim 8, wherein the first scan line, the second scan line, and the second emission line are connected to a same pixel of the pixels.

20. The display device of claim 6, wherein a pixel of the pixels connected to the second scan line and the second emission line is not connected to the first scan line.

* * * * *